United States Patent
Hennig et al.

(10) Patent No.: US 6,677,750 B2
(45) Date of Patent: Jan. 13, 2004

(54) METHOD FOR MEASURING THE MAGNETIC RESONANCE (NMR) BY STEADY STATE SIGNALS (SSFP)

(75) Inventors: Jürgen Hennig, Freiburg (DE); Klaus Scheffler, Basel (CH); Oliver Speck, Freiburg (DE)

(73) Assignee: Universitätsklinikum Freiburg (DE)

( * ) Notice: Subject to any disclaimer, the term of this patent is extended or adjusted under 35 U.S.C. 154(b) by 0 days.

(21) Appl. No.: 10/211,420

(22) Filed: Aug. 2, 2002

(65) Prior Publication Data

US 2003/0030436 A1 Feb. 13, 2003

(30) Foreign Application Priority Data

Aug. 8, 2001 (DE) .......................... 101 38 961

(51) Int. Cl.⁷ .................................. G01V 3/00
(52) U.S. Cl. ........................ 324/307; 324/309
(58) Field of Search .................. 324/307, 309, 324/312, 314, 306, 300

(56) References Cited

U.S. PATENT DOCUMENTS

| | | | | |
|---|---|---|---|---|
| 4,973,906 A | * | 11/1990 | Bernstein | 324/309 |
| 5,034,692 A | * | 7/1991 | Laub et al. | 324/309 |
| 6,310,478 B1 | * | 10/2001 | Heid | 324/309 |
| 6,320,381 B1 | | 11/2001 | Hennig | |
| 6,339,332 B1 | * | 1/2002 | Deimling | 324/309 |

FOREIGN PATENT DOCUMENTS

| | | |
|---|---|---|
| DE | 40 04 185 C2 | 8/1997 |
| DE | 198 36 612.4-33 C2 | 6/2000 |
| DE | 199 01 763.8 A1 | 7/2000 |
| DE | 199 00 578.8-33 C1 | 11/2000 |
| EP | 92 306 620.3 A1 | 2/1993 |

OTHER PUBLICATIONS

H.T. Carr, "Steady–State Free Precession in Nuclear Magnetic Resonance", Physical Review, Dec. 1, 1958, pp. 1693–1701, vol. 112, No. 5.

T.R. Brown, et al. "NMR Chemical Shift Imaging in Three Dimensions", Proc. Natl. Acad. Sci., pp. 3523–3526, vol. 79, Jun. 1982, USA.

A. Oppelt, et al. "FISP: Eine Neue Schnelle Puls–Sequenz fur die Kernspintomographie", Electromedica 54 (1986) Heft 1, pp. 15–18.

M. Deimling and O. Heid, "Magnetization Prepared True FISP Imaging", p. 495.

* cited by examiner

*Primary Examiner*—Louis Arana
(74) *Attorney, Agent, or Firm*—Walter A. Hackler

(57) ABSTRACT

A method of magnetic resonance (NMR) for spatially resolved measurement of the distribution of NMR signals of metabolites (CSI) with low signal intensity, wherein on a spin ensemble, a sequence of radio frequency (RF) pulses is applied which are mutually offset by a time interval of a repetition time TR and magnetic gradient fields are switched of which at least one causes spatial encoding of the excited spins, is characterized in that the repetition time TR between the exciting RF pulses is selected to be at the most in the magnitude transverse relaxation time $T2^*$ of the spins to be excited, preferably approximately $T2^*/10$ and that the magnetic gradient fields are selected such that their action integral is completely balanced over a repetition period of a time period TR such that NMR signal production is carried out according to the principle of steady state free precession (SSFP). This new method permits utilization of the advantages of SSFP methods also for spectroscopic recordings, in particular for chemical shift imaging.

13 Claims, 8 Drawing Sheets

METHOD FOR MEASURING THE MAGNETIC RESONANCE (NMR) BY STEADY STATE SIGNALS (SSFP)

This application claims Paris Convention priority of DE 101 38 961.2-33 filed on Aug. 8, 2001, the entire disclosure of which is hereby incorporated by reference.

BACKGROUND OF THE INVENTION

The invention concerns a nuclear magnetic resonance (NMR) method for spatially resolved measurement of the distribution of NMR signals of metabolites (CSI) with low signal intensity, wherein a sequence of radio frequency (RE) pulses, which are mutually offset at a time interval of a repetition time TR, is applied to a spin ensemble and magnetic gradient fields are switched, of which at least one causing encoding of the excited spins.

A method of this type is known e.g. from the publication by T. R. Brown et al. "NMR chemical shift imaging in three dimensions", Proc. Natl. Avad. Sci. USA, Vol. 79, 3523–3526 (1982).

To measure the spatial distribution of metabolites, one uses today conventionally the so-called chemical shift imaging (CSI) method wherein a signal is recorded through repeating an excitation with the corresponding excitation pulses which can be carried out with spatial selectivity for selecting a partial volume. The excitation steps are thereby repeated at a time interval TR, wherein TR is within the magnitude of the longitudinal relaxation time T1 of the observed metabolites to avoid signal saturation. The recording is thereby often very inefficient since the signal decays with the decay constant $T2^*$, wherein $T2^*$ is much smaller than TR due to magnetic field inhomogeneities such that the actual useful time of data recording is very small compared to TR.

The method of steady-state free precession (SSFP) (Carr H Y, Phys. Rev. 112, 1693 (1958) presented by Carr in 1958 has much more efficient signal recording in comparison therewith. Therein, application of a regular sequence of radio frequency pulses produces steady state magnetization which is read out in the time interval between the pulses. The magnetization strength depends on the resonance frequency of the observed spins. In the preferred implementation, the phase of subsequent pulses is alternated. For spins, which experience dephasing by 180° in the time interval TR between two pulses, the signal is thereby minimized.

For MR imaging (i.e. measurement of the proton density), this so-called trueFISP method (also called balanced FFE or FIESTA) has already been established (Oppelt A et al, electromedica 54, 15 (1986) and is often used with new devices since the available rapid gradient systems can achieve repetition times of typically TR<5 ms which are short enough to prevent image artefacts which are produced by the signal cancellation of spins which are dephased by field inhomogeneities.

There are approaches of optimizing the behavior of magnetization in the transition phase from the balanced state into the steady state. Initialization with a pulse with half a flip angle is introduced here which precedes the following sequence at a time interval of preferably TR/2 (Deimling M, Heid O. Magnetization prepared true FISP imaging. In: Proceedings of the $2^{nd}$ Annual Meeting of the Society of Magnetic Resonance, San Francisco, 1994, p. 495). Also more recent solutions with other preparation phases are known.

For applications in proton imaging, trueFISP is therefore established as method for very effective data recording.

Applications for localized spectroscopy with SSFP methods and for measuring the spatial distribution of metabolites were not yet reported although the small efficiency of data recording of conventional methods and the associated long measuring times are the main problem of in vivo MR spectroscopy.

The reason therefore is the fact that the SSFP signal mechanism primarily and obviously eliminates spectroscopic information since spins are refocused independent of their resonance frequency and therefore give a non-distinguishable contribution to the entire signal and the differentiation of spins of different chemical shifts (and therefore different resonance frequencies) desired in spectroscopy is lost.

In contrast thereto, it is the underlying purpose of the present invention to improve a method of the above-mentioned type such that the above-discussed disadvantages can be eliminated. The invention is to present in particular a new method with the aim that the advantages of SSFP methods can still be used for spectroscopic recordings and in particular for chemical shift imaging.

SUMMARY OF THE INVENTION

This object is achieved in accordance with the invention in an effective fashion in that the repetition time TR between the exciting RF pulses is selected to be in the magnitude of the transverse relaxation time $T2^*$ of the spins to be excited at the most and that the magnetic gradient fields are selected such that their action integral over a repetition time of a length of TR is zero such that NMR signals are produced according to the principle of steady state free precession (SSFP).

A drastically reduced repetition time TR compared to conventional CSI recordings and switching of integrally completely balanced gradients permits maintenance of the spectroscopic information of chemical shift also for SSFP recordings. This permits utilization of the advantages of SSFP methods also for spectroscopy.

One variant of the inventive method is particularly preferred wherein the repetition time TR is selected to be between 1 and 100 ms, preferably between 5 and 20 ms. The optimum chosen repetition time Tr depends on the other experimental parameters. The above-mentioned values are valid in particular for application of a homogeneous NMR magnetic field B in the magnitude of 1–2 tesla.

The signal recording time TAQ is usually always smaller than the repetition time TR. The signal-to-noise ratio per time unit is particularly large when the signal recording time TAQ is selected to be slightly smaller than TR, preferably TAQ$\leq$0.95 TR.

In a further development of this method variant, the signal acquisition is always carried out when no RF pulses are currently irradiated. In this fashion, the NMR signal can be optimized with respect to noise minimization.

In a particularly preferred variant of the inventive method, RF pulses are irradiated and temporally variable magnetic gradient fields are selected for spatial encoding according to the principle of the spatially resolved Fourier transformation method. This greatly facilitates reconstruction of spatially resolved images of the metabolites from the recorded NMR signals.

In a further preferred method variant, switching of a magnetic gradient field spatially limits the excitation volume simultaneously with irradiation of the exciting RF pulses. This facilitates precise limitation of the NMR measurement to certain parts of the measuring object thereby keeping disturbances and noise outside of the zone of interest away from the signals.

A further development of this method variant is characterized in that the direction and amplitude of the slice selection gradient is varied from one recording step to the next, thereby further limiting the measuring volume to the region in which the SSFP condition is met. This limits the interesting measuring volume in several dimensions to permit precise selection of very special subvolumes in the measuring object.

In a further particularly preferred variant of the inventive method, the NMR recording is repeated several times thereby varying the measuring frequency such that the signal intensities of several NMR signals of different resonance frequencies overlap in a characteristic fashion across the measured signal intensity as a function of the measuring frequency.

As an alternative or supplement, a further method variant provides that the NMR recording is repeated several times thereby varying a phase increment between subsequent RF pulses such that the signal intensities of several NMR signals of different resonance frequencies overlap in a characteristic fashion across the measured signal intensity as function of the phase increment between subsequent RF pulses.

In both method variants (and combinations thereof) the signal intensities associated with the individual resonances can be determined by calculating methods known per se.

In a further advantageous variant of the inventive method, RF pulses with alternating flip angle $\alpha$ or phase increments of 180° are selected. Usually, the highest possible signal intensities can be achieved.

One variant of the inventive method is also advantageous wherein RF pulses with a flip angle $\alpha$ are selected such that $\cos \alpha = (T1/T2-1)/(T1/T2+1)$ wherein T1 is the longitudinal relaxation time and T2 is the transverse relaxation time without taking into consideration the susceptibility effects. For metabolites wherein T1 and T2 is known, the NMR signal can be maximized.

Further advantages of the invention can be extracted from the description and the drawing. The features mentioned above and below can be used in accordance with the invention either individually or collectively in any arbitrary combination. The embodiments shown and described are not to be understood as exhaustive enumeration but rather have exemplary character for describing the invention.

The invention is shown in the drawing and explained in more detail by means of embodiments.

Etf/Efid is ~8 at f=1.

Figure 6:
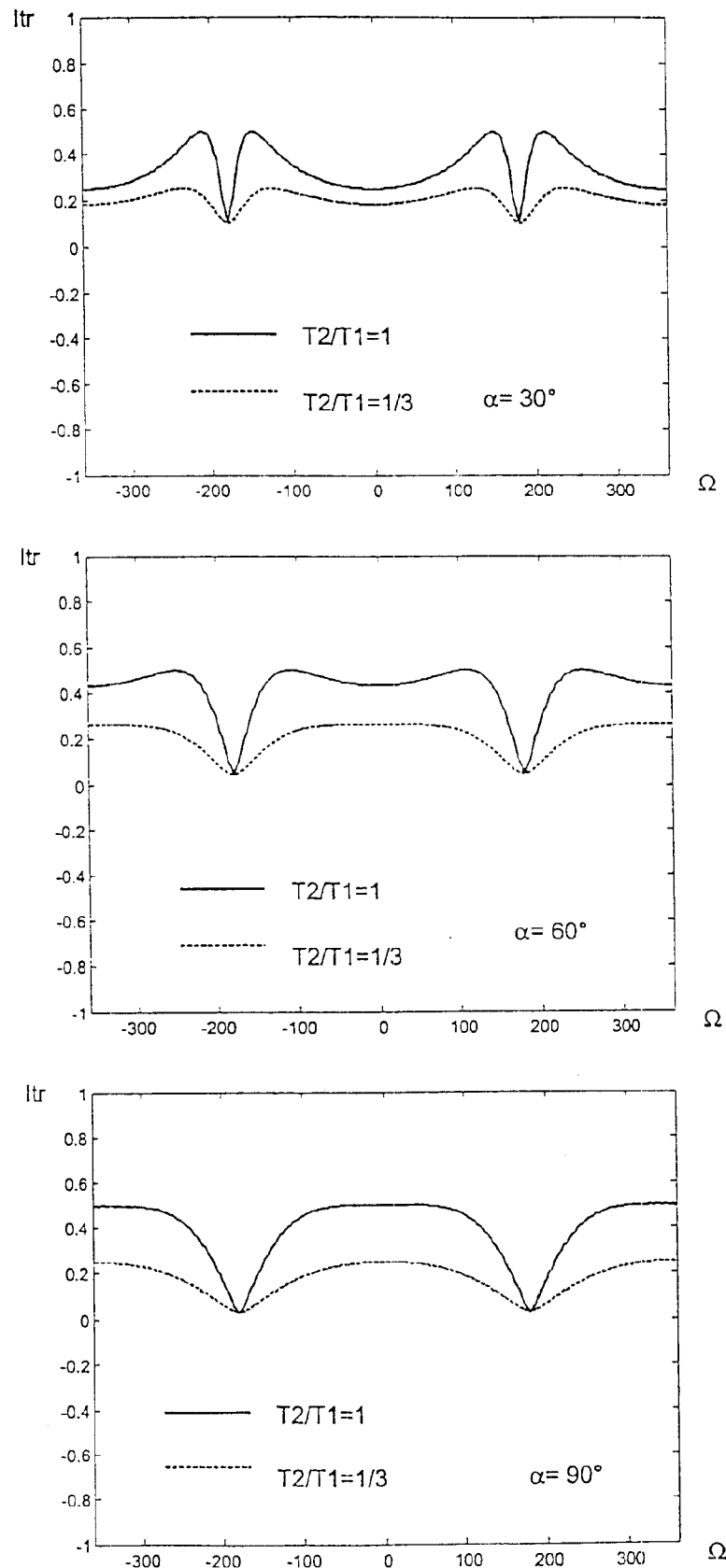
Figure 7:
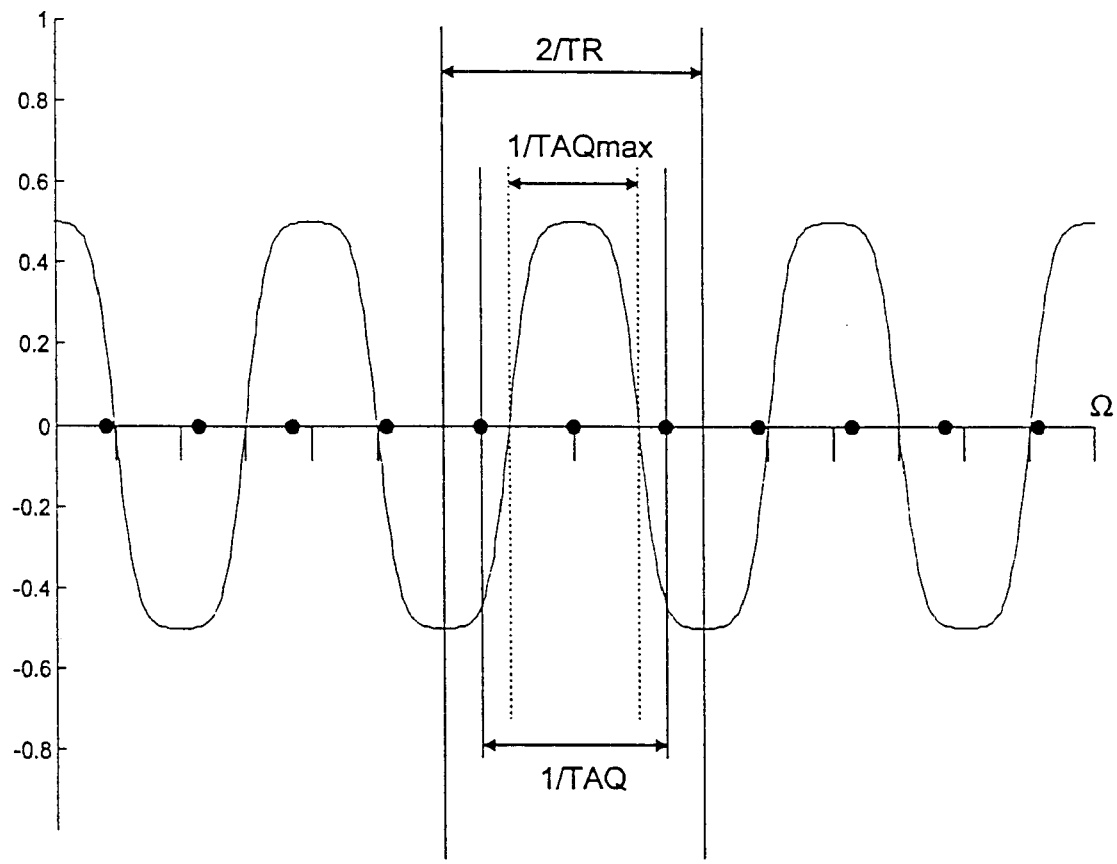

FIG. 6 contribution of the signal intensity Abs(Itr) of the SSFP sequence as function of the off resonance frequency $\Omega$ for flip angle $\alpha$=30° (top), 60° (center) and 90° (bottom) for different ratios of T2/T1 and for recordings with alternating pulse phase. One can see that the shape of Itr($\Omega$) depends only little on the T2/T1 ratio;

FIG. 7 spectral resolution of the SSFP-CSI recording: the spectral resolution is determined by 1/TAQ, the grid of the spectral recording is marked by thick dots. The signal intensities measured in each case are determined by the dependence on the resonance frequency, i.e. the signal intensities are correspondingly modulated. In contrast to FIG. 6, the modulation function itself is shown and not its contribution to indicate the periodic inversion of the signals.

Figure 8:
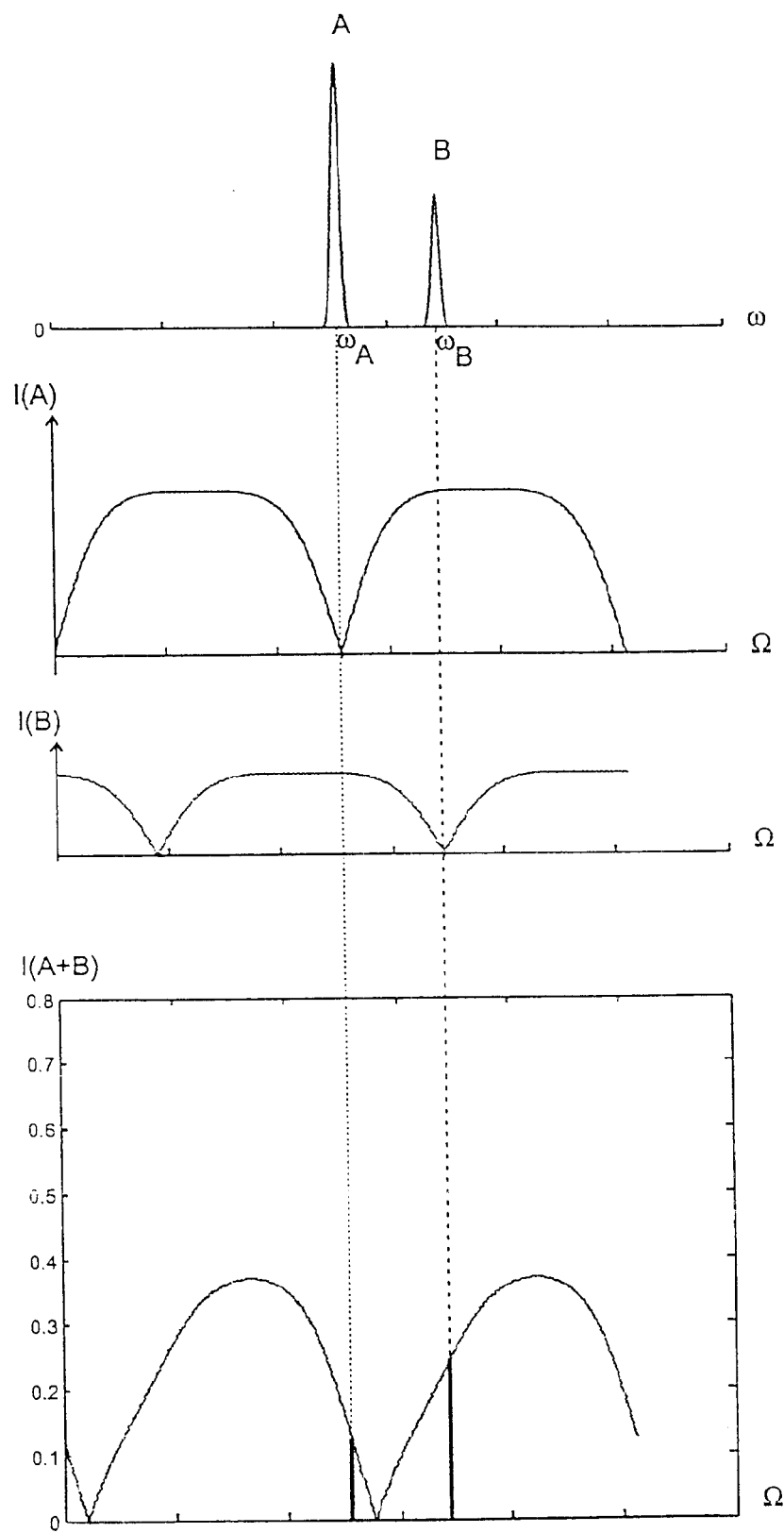

FIG. 8 recording of the signals of two metabolites A and B with the resonance frequencies $\Omega_A$ and $\Omega_B$. The recording can be carried out such that the signal of one metabolite each becomes 0.

DESCRIPTION OF THE PREFERRED EMBODIMENT

Figure 1:
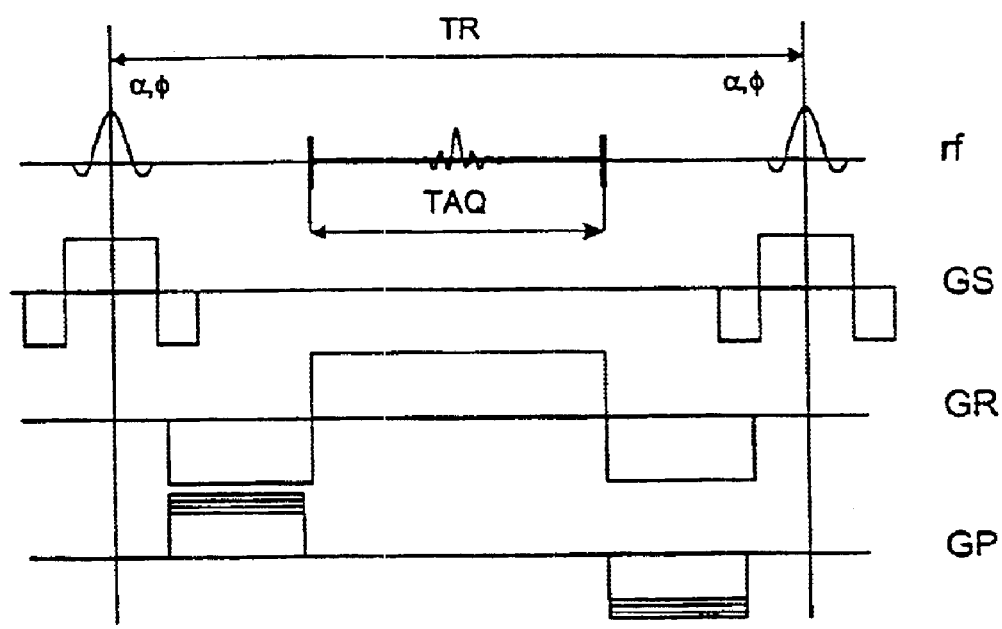
FIG. 1 a trueFISP method according to prior art: rf characterizes the radio frequency pulses with flip angle $\alpha$ and phase $\phi$ and the signal recorded within the acquisition time TAQ; GS, GR and GP characterize the slice selection, read and phase gradients.

The trueFISP method for proton imaging corresponding to prior art is shown in FIG. 1. The radio frequency pulses with flip angle $\alpha$ and phase $\phi$ are designed as selective pulses for recording as slice selection pulses in connection with the read gradient GS, the phases $\phi$ of subsequent pulses preferably differ by 180°, e.g. $\phi$u (uneven recording period)=0° and $\phi$g (even recording period)=180°.

To use the trueFISP method for the recording as 1, 2 or 3-dimensional chemical shift imaging (CSI)=method, the recording is carried out without read gradient and spatial encoding is replaced by phase gradients in 1, 2 or 3 spatial directions. The excitation pulse can thereby be produced in a slice-selective fashion either through application of a corresponding gradient during the pulse (for 2D-CSI encoding in FIG. 2a), (shown for 2D-CSI encoding in FIG. 2a) for 3D-CSI encoding (FIG. 2b), the slice selection can be omitted.

Figure 3A:
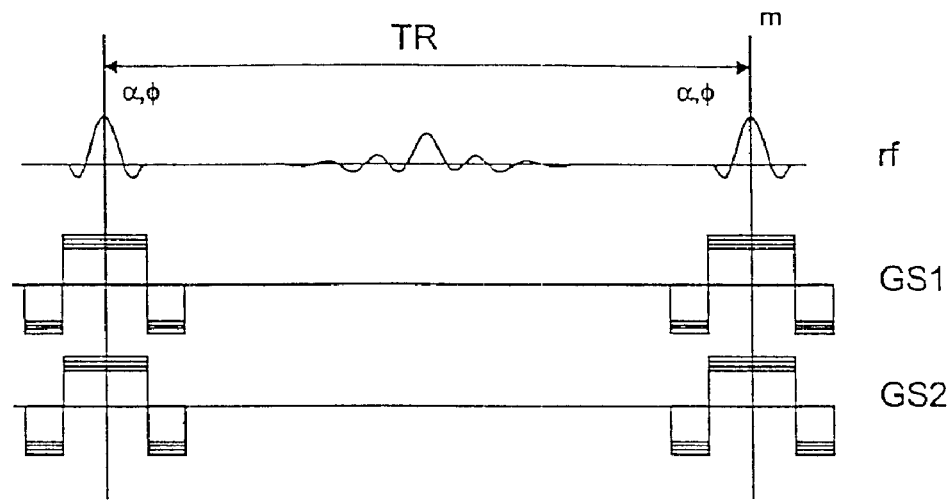
In FIG. 3a), two orthogonal slices are varied in successive recordings, FIG. 3b) shows further limitation through variation of the slice selection gradients in all 3 spatial directions.

Further limitation of the volume within which the above-mentioned condition for producing a steady state signal is achieved by alternating pulse phases in subsequent pulses within a square or cylindrical partial volume is given when the slice selection is varied in subsequent pulses (FIG. 3a).

In the most simple case, subsequent pulses with alternating phase are applied to orthogonal slices each. The SSFP condition is then met only for the spins in the sectional volume of the two slices. This alternation of the slice plane corresponds formally to a recording with rotation of the slice level from one excitation to the next by $\Delta\Phi_s=90°$. Selection of other values for $\Delta\Phi_s$ corresponding to a slower rotation of the slice level permits selection of cylindrical excitation volumes with corresponding different shapes. For $GS1^2+GS2^2=1$, the thickness of the selected slice is always identical and the selected volume becomes isotropic in the direction of GS1 and GS2.

Figure 3B:
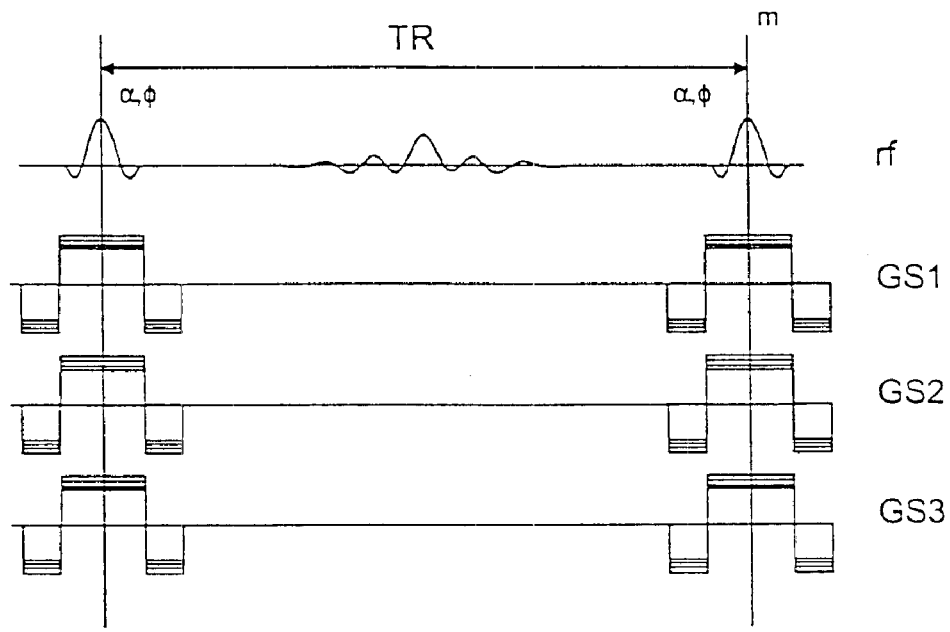
FIG. 3 SSFP methods for selection of a partial volume by means of slice selection gradient in accordance with the invention.

Finally, a cubic or spherical volume can be applied by applying variable slice selection gradients in all three spatial directions (FIG. 3b). $GS1^2+GS2^2+GS3^2=1$ selects a spherical volume. It is advantageous in this manner if the length of a recording cycle is an integral under different gradients which permits the most simple realization of the condition of phase alternation in the target region.

The position of the volume defined according to one of the described steps can finally be positioned anywhere in space via corresponding selection of the excitation pulse frequency. The different possible definitions of the volume coverage through slice selection can be combined in any fashion with the kind of spatial encoding corresponding to the FIGS. 2a and 2b to obtain spatial resolution within the selected partial volumes.

The acquisition time TAQ is smaller than TR. TR is generally selected to be short (in the range of a few ms) to minimize susceptibility-based phase effects which disturb the SSFP condition. For n1 data points which are recorded within TAQ, the recording bandwidth BW=n1/TAQ is correspondingly large. For encoding a 2-dimensional image with np1 phase encoding steps in the direction GP1 and np2=n1 steps in the direction of GP2, np1×np2 recording steps are required corresponding to a total recording time Tges of np1×np2×TR.

Observation of the signal-to-noise ratio per time unit of a recording with conventional trueFISP with read-out by a read gradient corresponding to FIG. 1 and a CSI phase encoding (FIG. 2a), shows that these are initially identical according to the basic theorems of the signal theory.

Figure 2A:
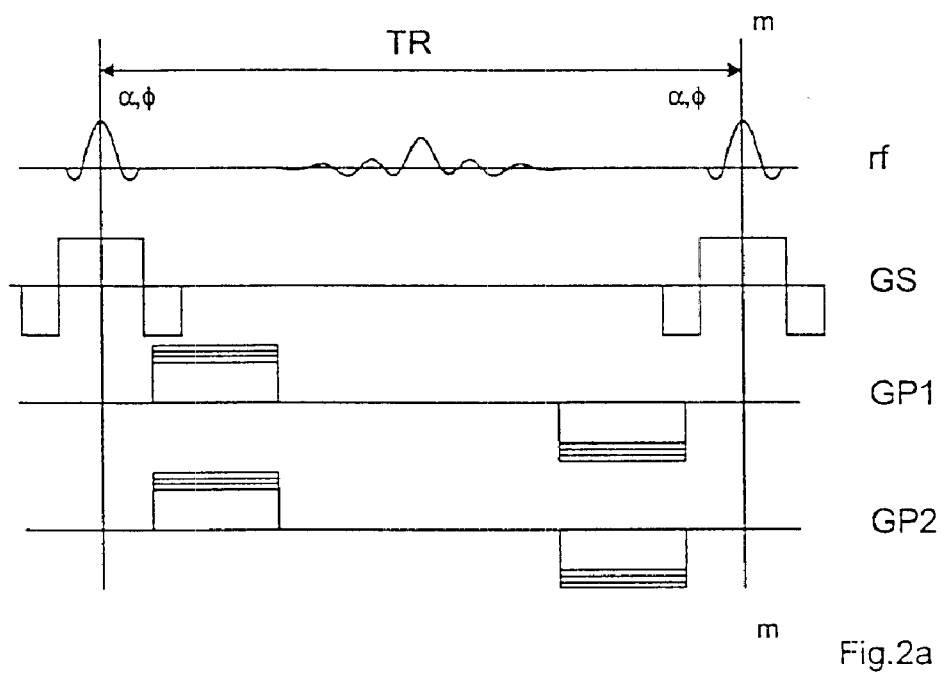
FIG. 2 SSFP method with 2D-CSI encoding in accordance with the invention:
a) the recording is spectroscopical without gradient, a two-dimensional spatial encoding is produced by successive variation of GP1 and GP2 in an orthogonal direction each.
b) trueFISP method with 3D-CSI encoding: the recording is carried out spectroscopically without gradient, three-dimensional spatial encoding is carried out by successive variation of GP1, GP2 and GP3 in an orthogonal direction each.
Figure 2B:
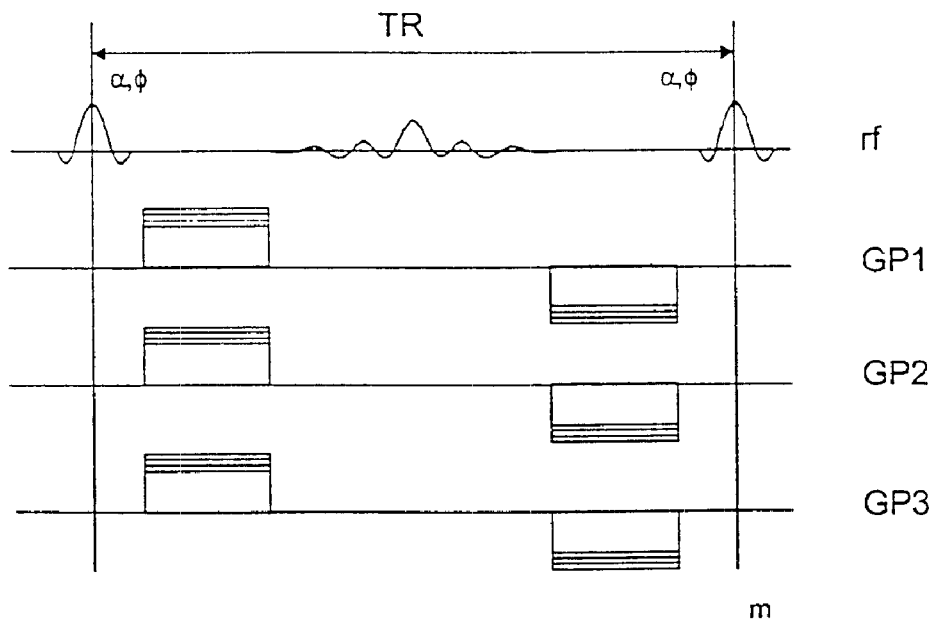

In conventional recording with n1 points, np2 recordings are repeated to obtain the same measuring time of np1×np2×TR of the recording with CSI encoding corresponding to FIG. 2b. Corresponding to BW=n1/TAQ, the signal-to-noise ratio is reduced compared to the CSI recording by a factor of n1 per recording step, with n1-fold averaging, the factor is compensated again.

CSI encoding is advantageous when the bandwidth per pixel dwp=1/TAQ determined by TAQ is larger than the line width of the observed resonances. For typical values for TAQ in the region of a few ms, the bandwidth per pixel is in the range of several hundred Hz compared to a line width of 5–10 Hz determined substantially by magnetic field inhomogeneities. The line is therefore smeared across the entire pixel with spatial encoding with a read gradient (FIG. 1).

For recording through phase encoding (FIG. 2a), the signal intensity however is focused by the spectral resolution to the resonance frequency and therefore all noise contributions outside of the resonance signal are separated which considerably improves the signal-to-noise ratio.

A further advantage of spectral recording results from the signal intensity as function of the off resonance frequency. Due to the finite length of the pulses and phase encoding gradients, TAQ=f*TR with f<1. The spectral resolution SW of the data recording results for complex signals in SW=1/TAQ according to the Nqyuist theorem. Correspondingly, signals whose resonance frequency differs by 1/TAQ can be recorded separately and their distribution can be determined separately.

As shown in FIGS. 2a and 2b, the method can be applied as CSI method for measuring the total intensity of all signals of the spin species observed. This is generally not sensible for conventional proton imaging on the basis of the dominant signal portions of water and fat since for high-resolution images of an approximate matrix size of 128×128 even with TR=2–4 ms, the total recording time Tges is in the region of one minute and a conventional trueFISP experiment provides a sufficient signal-to-noise ratio already with n1-fold faster recording.

For CSI applications for observing metabolite signals and in particular signals of other nuclei, the CSI recording can be utilized in a useful fashion. A preferred application is in phosphor spectroscopy which is used in in vivo applications mainly to examine the energy metabolism and the phosphorester metabolism. Of the resonances observed in the in vivo spectrum, in particular the signals of phosphomonoesters and the phosphocreatin are suited for SSFP observation since they have a relatively favorable T2/T1 ratio.

The efficiency of data recording compared to conventional recording through CSI with long TR is compared below:

If T2* effects can be neglected and for TR<T1, T2, the signal intensity Itf of an SSFP recording for on-resonance spins is given by $$Itf=I0*\sin(\alpha)/(1+T2/T1+\cos(\alpha)*(1-T2/T1)) \qquad [1]$$

wherein I0 represents the equilibrium signal given by the spin density, $\alpha$ is the flip angle of the pulses. Equation [1] shows that I becomes large in particular for large values of T2/T1. Due to T2<T1, the maximum value for I is obtained at T2=T1.

The recording by SSFP-CSI therefore represents the possibility of spatially resolved selective spectroscopic observation of narrow resonances (relatively long T2).

To compare the efficiency of the recording with conventional spectroscopic recording technology, the intensity given by equation [1] must be set into relation with the intensity with multiple repetition of the recording of a free induction decay (FID) as it is applied in spectroscopy. For a repetition time TR and a decay time T2*, the intensity Ifid is given by $$Ifid=Iss\ exp(-t/T2*) \qquad [2]$$

Iss is thereby the steady state intensity corresponding to $$Iss=I0\ (1-exp(-TR/T1)) \qquad [3]$$

The signal amplitude Ass results through integration via Ifid via the recording time TAQ from equations [2] and [3]:

$$Ass=I0\ T2*(1-exp(-TR/T1))(1-exp(-TAQ/T2*)) \qquad [4]$$

The signal-to-noise ratio is calculated $$Sfid=Ass/\sqrt{TAQ}. \qquad [5]$$

Sfid initially increases with increasing TAQ, with long TAQ, it decreases again since the signal which decays with T2* becomes small compared to constant noise. It can be shown that the maximum average signal amplitude is approximately 57% of Iss. Averaged over the entire recording time, one obtains from [2]–[5] an average signal yield Efid of the recording of $$E_{fid}=Sfid*TAQ/TR=I0T2*(1-exp(-TR/T1))(1-exp(-TAQ/T2*))\sqrt{TAQ/TR} \quad [6]$$

If the acquisition time of the SSFP recording is selected to be so short that T2* effects can be neglected, the corresponding signal yield of the trueFISP signal results with acquisition over the same period TR corresponding to equation [1] in:

$$Etf=fItf\sqrt{TR}=fI0*\sin(\alpha)/(1+T2/T1+\cos(\alpha)*(1-T2/T1))\sqrt{TR} \quad [7]$$

f is thereby a factor stating which portion of the entire measuring period is used for data acquisition in trueFISP recording. For very short pulse sequences, f 0.5 since then the duration of the pulses and of the phase encoding gradients becomes similar to TAQ. For longer intervals f~1.

Figure 4:
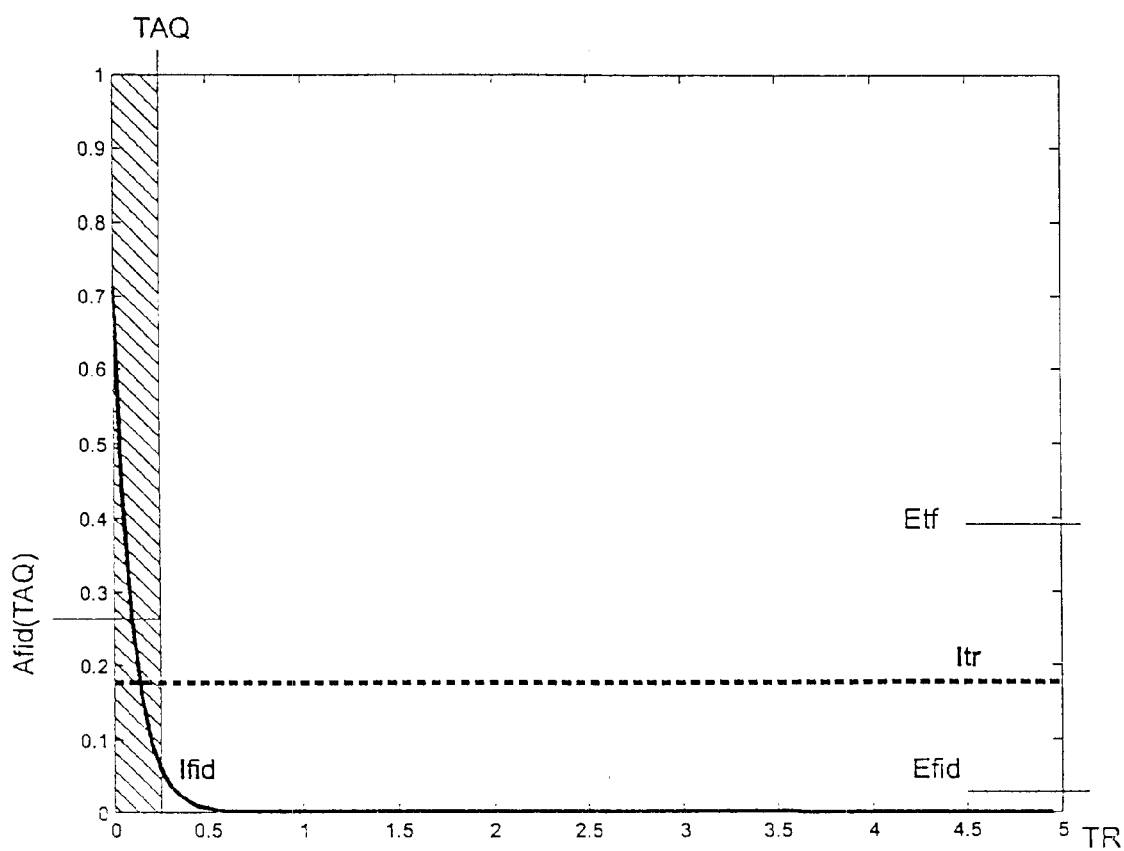
FIG. 4 comparison of the recording with SSFP and conventional recording for T1=4 s, T2=500 ms, T2*=50 ms, TR=5 s, TAQ for the conventional recording=60 ms (corresponds to maximum signal-to-noise). The FID signal Ifid is characterized by the thick fully drawn exponential signal decay, the SSFP amplitude Itr corresponds to the thick broken line. The parameters correspond to the measurement of phosphocreatine in in vivo 31P spectroscopy. The efficiency ratio Etf/Efid is calculated at 14:1, with f=TAQ/TR= 0.7 for the SSFP acquisition Etf/Efid~10. The shaded area represents the recording time of the FID, with longer TAQ, S/N drops. Afid(TAQ) is the central value of the FID amplitude over TAQ.

A comparison of equation [6] and equation [7] shows that the two methods depend in a very different fashion on the physical parameters T1, T2 and T2*. FIG. 4 shows that, for recording parameters which are typical for metabolite spectroscopy, the signal yield of the trueFISP recording is more than 10 times larger than with conventional spectrum acquisition! This corresponds to a reduction of the measuring time by more than a factor of 100 to obtain the same signal-to-noise ratio.

Figure 5:
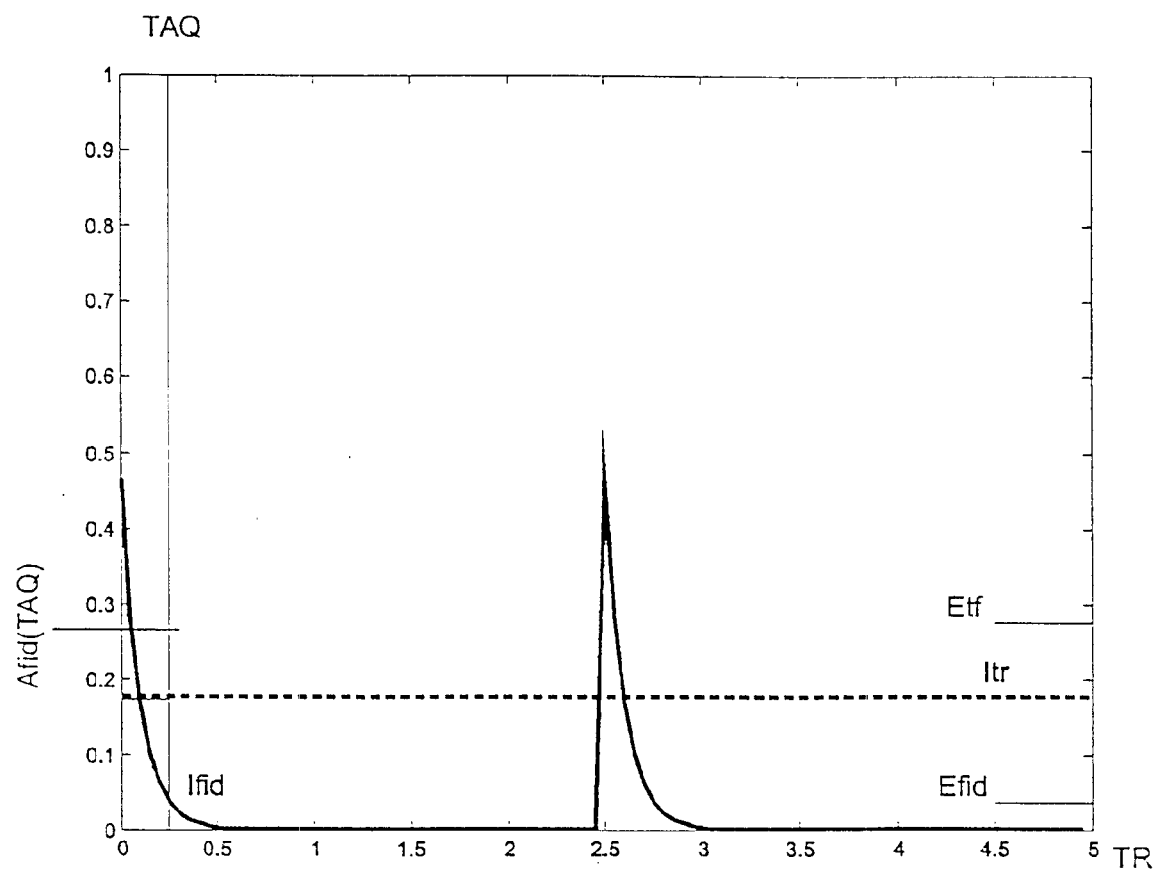
FIG. 5 recording with parameters of FIG. 4, however, with TR=2.5 s. The short repetition time reduces the signal amplitude Ifid, the efficiency of the FID recording is still improved by the double number of FIDs per time unit.

A shift in efficiency occurs when T1 of the examined metabolite is short and correspondingly short repetition times are selected for data recording (FIG. 5). When very short repetition times are used in conventional recording technology, the signal yield Efid is increased, however, these parameters favor mainly signals of spins with short T1 which is true in the metabolite spectroscopy for molecules of average size (1000–10000 atomic units) which are associated to unspecific substances and whose measurement is often undesired. TrueFISP therefore produces a high signal yield mainly for signals with narrow lines.

Recording with trueFISP therefore produces a considerable signal gain compared to conventional spectroscopy compared to conventional recording mainly for metabolites with relatively long T2 (sharp lines). Equations [6] and [7] clearly show that trueFISP is particularly advantageous when T2*<T2, i.e. for observing signals of small metabolites with long T2.

The preferred application therefore refers to the observation of signals with T2>T2*, i.e. the line width is determined by magnetic field inhomogeneities and susceptibility effects and not by T2. Moreover, it must be stated that the above calculation neglects T2* effects over the acquisition time of the SSFP recording, i.e. TAQ<T2*.

The different metabolites can be differentiated corresponding to the principle of chemical shift imaging via Fourier transformation of the recorded steady state signal. Corresponding to the Nyquist theorem, the spectral resolution is thereby dw=1/TAQ, the bandwidth of the recording results for n1*dw. In the border case which is practically not realizable, when the duration of the radio frequency pulses and the phase encoding gradients is neglected, TAQmax=TR and therefore dwmax=1/TR. In contrast to conventional recording, it must be taken into consideration that the signal amplitude is modulated corresponding to the dependence on Ω shown in FIG. 6. For TAQ<TR, one obtains the image screen shown in FIG. 7. To optimize S/N, the SSFP recording is carried out typically with a repetition time in the region of 1–50 ms, dw is therefore in the region of approximately 20–1000 Hz. This shows clearly that SSFP-CSI has a considerably worse spectral resolution than conventional CSI.

Improvement of the spectral resolution is possible through the dependence of the signal intensity on the off resonance frequency. If the recording is repeated with different recording frequency, this corresponds to a shift of the recording screen shown in FIG. 7 compared to SSFP modulation.

Change of the respective carrier frequency by $\Delta\Omega$ can be calculated without any problem into a phase increment of the phase of subsequent pulses. Therefore, the signal behavior of a recording with a frequency shifted by $\Delta\Omega$ compared to the resonance frequency with identical pulse phase is identical to a recording on-resonance ($\Delta\Omega=0$) but with a linear phase increment $\Delta\Phi$ (in radians) corresponding to $$\Delta\Phi=2\pi TR/\Delta\Omega \quad [9]$$

As shown in FIG. 6, one obtains in particular for an off-resonance frequency $$\Omega 0=1/(2TR) \quad [10]$$

signal cancellation with alternating pulse phase. This corresponds to $\Omega=0$ (on resonance) for a constant pulse phase. The position of the resonance frequencies can be correspondingly determined via the signal modulation as function of the recording frequency (or of the phase increment).

Recording at selected measuring frequencies which correspond to signals of interest or also by successive recording via a measuring frequency region of interest, the intensities of the respective individual signals can be determined correspondingly.

To record chemical shift selective images of the distribution of metabolites with known resonance frequency, in a preferred implementation the recording can be carried out such that recording takes place in several recording steps such that in each individual recording one signal each is suppressed or minimized (FIG. 8). The measured signal intensity represents the sum of the intensities of the respective other signals within the resolution region.

If the number and exact position of the lines of the spectrum to be observed is not known, the recording is carried out such that corresponding selection of the recording conditions measures the signal intensity as function of Ω. The position, intensity and number of the individual lines of the spectrum can then be calculated via corresponding algorithms as linear superposition of individual signal dependencies each.

The signal contributions of individual resonances can then be determined through solution of the resulting equation system corresponding to the superposition of the contributions of the individual signals according to one of the current methods for solving linear equation systems (regression, Marquardt algorithm etc.).

Finally, signals of undesired resonances (e.g. fat and/or water signals for proton-CSI) can be suppressed according to prior art in that the recording is carried out such that the modulation function corresponding to FIG. 7 for these signals is at zero passage. Moreover, during the sequence, corresponding radio frequency pulses can be applied for additional suppression of these signals.

We claim:

1. A method of magnetic resonance (NMR) for spatially resolved measurement of the distribution of NMR signals of metabolites (CSI) with low signal intensity, the method comprising the steps of:

applying, to a spin ensemble for causing excited spins, a sequences of radio frequency (RF) pulses which are mutually offset at a temporal interval of a repetition time (TR);

spatially encoding the excited spins by application and switching of magnetic gradient fields;

selecting the repetition time (TR) between the exciting RE pulses to be at most a transverse relaxation time T2* of the excited spins;

selecting the magnetic gradient fields in order to provide an action integral which produces zero over a temporal length between repetition times (TR) such that NMR signals are generated according to the principle of steady state free precession (=SSFP); and recording the NMR signals during a signal recording time TAQ.

2. The method according to claim 1, wherein the repetition time TR is selected to be between 1 and 100 ms.

3. The method according to claim 1, wherein the repetition time TR is selected to be between 5 and 20 ms.

4. The method according to claim 1, wherein the signal recording time TAQ is selected to be $<\approx$TR.

5. The method according to claim 1, wherein the signal recording time TAQ is selected to be $\leq 0.95$TR.

6. The method according to claim 4, wherein the NMR signal acquisition is carried out at time when no RE pulses are applied.

7. The method according to claim 1 wherein the RF pulses and magnetic gradient fields are temporally varied in order to spatially encode the excited spins according to the principle of the spatially resolved Foruier transformation method.

8. The method according to claim 1 further comprising the step of limiting an excitation volume by switching the magnetic gradient field simultaneously with the application of exciting RE pulses.

9. The method according to claim 8, wherein a direction and amplitude of a slice selection gradient is changed from one recording step to a next in order to further limit the excitation volume to a region in which the SSFP condition is met.

10. The method according to claim 1, further comprising the step of repeating NMR recording thereby varying a measuring frequency such that signal intensities of several NMR signals of different resonance frequencies are overlaid in a characteristic manner as a function of the measuring frequency over the measured signal intensities.

11. The method according to claim 1, further comprising the step of repeating NMR recording thereby varying a phase increment between subsequent RF pulses such that signal intensities of several NMR signals of different resonance frequency are overlaid in a characteristic fashion over the measured signal intensities as function of a phase increment between subsequent RF pulses.

12. The method according to claim 1, wherein FR pulses with alternating flip angle a or phase increments of 180° are selected.

13. The method according to claim 1, wherein RF pulses with a flip angle $\alpha$ are selected, such that cos $\alpha=(T1/T2-1)/(T1/T2+1)$, wherein T1 is a longitudinal relaxation time and T2 is the transverse relaxation time without taking into consideration susceptibility effects.

* * * * *